United States Patent
Ohno et al.

(10) Patent No.: US 9,054,171 B2
(45) Date of Patent: Jun. 9, 2015

(54) HEMT SEMICONDUCTOR DEVICE

(71) Applicant: Kabushiki Kaisha Toshiba, Minato-ku, Tokyo (JP)

(72) Inventors: Tetsuya Ohno, Nomi (JP); Yasunobu Saito, Nomi (JP); Hidetoshi Fujimoto, Kawasaki (JP); Akira Yoshioka, Nomi (JP); Takeshi Uchihara, Kawaguchi (JP); Toshiyuki Naka, Nonoichi (JP); Takaaki Yasumoto, Kawasaki (JP); Naoko Yanase, Tokyo (JP); Shingo Masuko, Kanazawa (JP); Tasuku Ono, Nonoichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/201,641

(22) Filed: Mar. 7, 2014

(65) Prior Publication Data

US 2015/0069468 A1 Mar. 12, 2015

(30) Foreign Application Priority Data

Sep. 12, 2013 (JP) .................. 2013-189746

(51) Int. Cl.
*H01L 29/66* (2006.01)
*H01L 29/778* (2006.01)
*H01L 29/20* (2006.01)
*H01L 29/06* (2006.01)

(52) U.S. Cl.
CPC ........ *H01L 29/7786* (2013.01); *H01L 29/7787* (2013.01); *H01L 29/2003* (2013.01); *H01L 29/0657* (2013.01); *H01L 29/66462* (2013.01)

(58) Field of Classification Search
CPC ............ H01L 29/0657; H01L 29/2003; H01L 29/4175; H01L 29/66431; H01L 29/66462; H01L 29/7787; H01L 43/08; H01L 29/7783; H01L 43/12
USPC ........... 257/194, 243, 76, 201, 289, 357, 191, 257/192, 13, 134; 438/791, 481, 634
See application file for complete search history.

(56) References Cited

U.S. PATENT DOCUMENTS

| 7,084,441 | B2* | 8/2006 | Saxler ........................ 257/243 |
| 8,390,027 | B2* | 3/2013 | Iwamuro ..................... 257/190 |
| 8,390,091 | B2* | 3/2013 | Renaud ....................... 257/471 |
| 2011/0260216 | A1* | 10/2011 | Hebert ........................ 257/194 |
| 2012/0043586 | A1* | 2/2012 | Nishimori et al. ........... 257/194 |
| 2012/0126293 | A1* | 5/2012 | Sumiya et al. .............. 257/201 |

(Continued)

FOREIGN PATENT DOCUMENTS

| JP | 2012-044113 A | 3/2012 |
| JP | 2013-008969 A | 1/2013 |
| WO | 2011024440 A1 | 3/2011 |

*Primary Examiner* — Mohammed Shamsuzzaman
(74) *Attorney, Agent, or Firm* — White & Case LLP (57) ABSTRACT

In one embodiment, a semiconductor device includes a first semiconductor layer of a first conductivity type or an intrinsic type. The device further includes a second semiconductor layer of the first conductivity type or the intrinsic type disposed above the first semiconductor layer. The device further includes a third semiconductor layer of a second conductivity type including a first upper portion in contact with the first semiconductor layer, a second upper portion located at a lower position than the first upper portion, a first side portion located between the first upper portion and the second upper portion, and a second side portion located at a lower position than the first side portion.

16 Claims, 8 Drawing Sheets

(56) References Cited

U.S. PATENT DOCUMENTS

| | | |
|---|---|---|
| 2012/0153355 A1 | 6/2012 | Umeda et al. |
| 2012/0211800 A1 | 8/2012 | Boutros |
| 2012/0267640 A1 | 10/2012 | Wu et al. |
| 2012/0326215 A1 * | 12/2012 | Srivastava et al. ............ 257/288 |

* cited by examiner

HEMT SEMICONDUCTOR DEVICE

CROSS REFERENCE TO RELATED APPLICATION

This application is based upon and claims the benefit of priority from the prior Japanese Patent Application No. 2013-189746, filed on Sep. 12, 2013, the entire contents of which are incorporated herein by reference.

FIELD

Embodiments described herein relate to a semiconductor device.

BACKGROUND

A high electron mobility transistor (HEMT) using GaN-based materials can take full advantages of properties of the GaN-based materials owing to a two-dimensional electron gas (2DEG) layer which is naturally generated at a hetero interface between a GaN (gallium nitride) layer and an AlGaN (aluminum gallium nitride) layer. The HEMT has been attracting attention as a device to be used in a next-generation amplifier and switching device. One of performances required for the HEMT is a dielectric breakdown voltage. The dielectric breakdown voltage is a maximum voltage which can be applied between a source electrode and a drain electrode of the HEMT.

The GaN layer and the AlGaN layer of the HEMT are stacked on a semiconductor substrate via a buffer layer. However, the semiconductor substrate and the GaN layer are different from each other in lattice constant and thermal expansion coefficient. Therefore, the buffer layer, the GaN layer and the AlGaN layer include dislocations which are a kind of crystal defects. These dislocations cause a leakage current when a high voltage is applied to the HEMT. Furthermore, when the breakdown voltage of the HEMT is increased, carriers are generated between the semiconductor substrate and the buffer layer to form an inversion layer or an accumulation layer. As a result, a state like a short channel is generated between the source electrode and the drain electrode, thereby generating a leakage current. These leakage currents serve as barriers against improvements of the breakdown voltage of the HEMT.

DETAILED DESCRIPTION

Embodiments will now be explained with reference to the accompanying drawings.

In one embodiment, a semiconductor device includes a first semiconductor layer of a first conductivity type or an intrinsic type. The device further includes a second semiconductor layer of the first conductivity type or the intrinsic type disposed above the first semiconductor layer. The device further includes a third semiconductor layer of a second conductivity type including a first upper portion in contact with the first semiconductor layer, a second upper portion located at a lower position than the first upper portion, a first side portion located between the first upper portion and the second upper portion, and a second side portion located at a lower position than the first side portion.

First Embodiment

Figure 1:
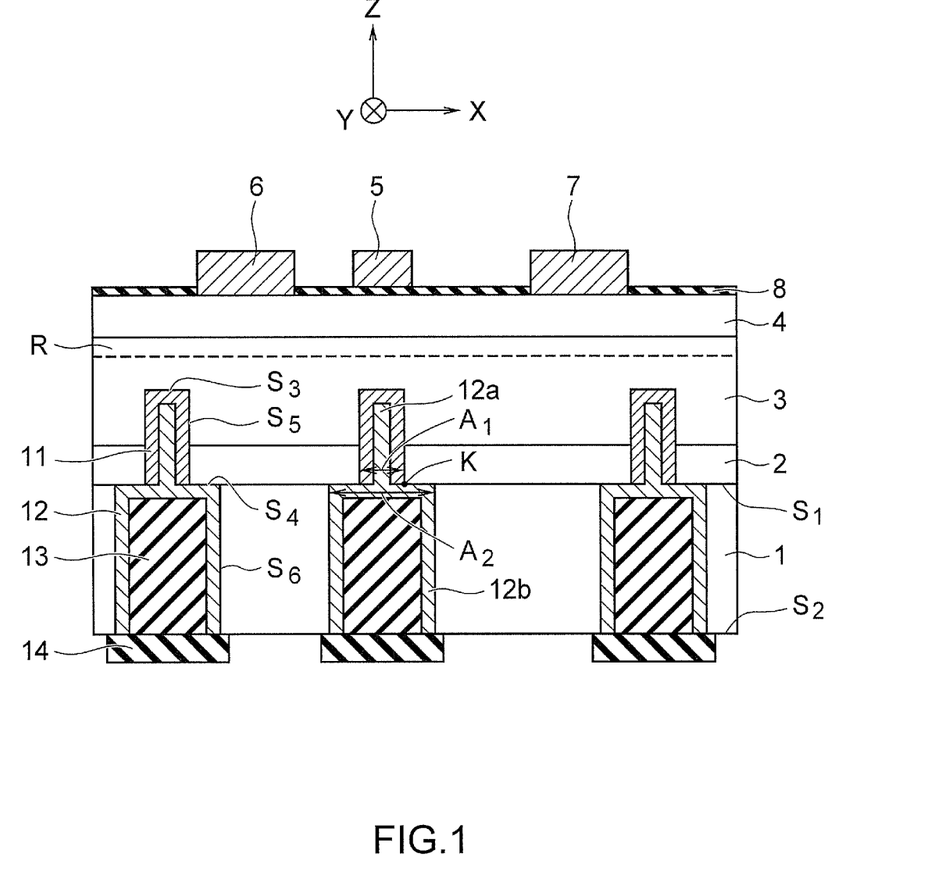
FIG. 1 is a cross-sectional view illustrating a structure of a semiconductor device of a first embodiment.

FIG. 1 is a cross-sectional view illustrating a structure of a semiconductor device of a first embodiment. The semiconductor device in FIG. 1 includes a HEMT as a power transistor.

The semiconductor device in FIG. 1 includes an n-type or p-type semiconductor substrate 1, a buffer layer 2 as an example of a first film, an n-type or i-type (intrinsic type) electron transit layer 3 as an example of a first semiconductor layer, an n-type or i-type electron supply layer 4 as an example of a second semiconductor layer, a gate electrode 5, a source electrode 6, a drain electrode 7, an insulator 8, first and second p-type semiconductor layers 11 and 12 as an example of a third semiconductor layer, and first and second insulators 13 and 14.

The first and second p-type semiconductor layers 11 and 12 in FIG. 1 are respectively examples of first and second layers of the third semiconductor layer. The n-type and the p-type are respectively examples of first and second conductivity types. It is noted that an i-type semiconductor layer indicates a semiconductor layer which intentionally contains no n-type and p-type impurities. The i-type semiconductor layer is also referred to as an undoped semiconductor layer.

The semiconductor substrate 1 includes an upper portion $S_1$ and a lower portion $S_2$. The semiconductor substrate 1 is, for example, a silicon substrate. FIG. 1 shows an X direction and a Y direction which are parallel to the upper portion $S_1$ and the lower portion $S_2$ of the semiconductor substrate 1 and perpendicular to each other, and a Z direction which is perpendicular to the upper portion $S_1$ and the lower portion $S_2$ of the semiconductor substrate 1.

In this specification, the +Z direction is treated as an upward direction, and the −Z direction is treated as a downward direction. For example, the positional relationship between the upper portion $S_1$ and the lower portion $S_2$ of the semiconductor substrate 1 is described that the upper portion $S_1$ of the semiconductor substrate 1 is located above the lower portion $S_2$ of the semiconductor substrate 1.

The buffer layer 2 is formed on the upper portion $S_1$ of the semiconductor substrate 1. The buffer layer 2 is, for example, a stack film including an AlN (aluminum nitride) layer, an AlGaN layer, a GaN layer and the like. The buffer layer 2 may be doped with carbon atoms.

The electron transit layer 3 is formed on the buffer layer 2. The electron transit layer 3 is, for example, an n-type or i-type GaN layer. A symbol R denotes a region where a 2DEG layer is produced at an upper end of the electron transit layer 3.

The electron supply layer 4 is formed on electron transit layer 3. The electron supply layer 4 is, for example, an n-type or i-type AlGaN layer.

The gate electrode (control electrode) 5 is formed on the electron supply layer 4 via the insulator 8. On the other hand, the source electrode (first main electrode) 6 and the drain electrode (second main electrode) 7 are formed directly on the electron supply layer 4, and electrically connected to the electron supply layer 4 to form ohmic contacts. The gate electrode 5 is placed immediately above a set of first and second p-type semiconductor layers 11 and 12. The source electrode 6 is placed at a position between two sets of first and second p-type semiconductor layers 11 and 12. Similarly, the drain electrode 7 is placed at a position between two sets of first and second p-type semiconductor layers 11 and 12. The gate electrode 5, the source electrode 6, and the drain electrode 7 are shaped to extend in the Y direction. The insulator 8 is, for example, a silicon oxide film or silicon nitride film.

Hereinafter, an arbitrary set of first and second p-type semiconductor layers 11 and 12 and first and second insulators 13 and 14 will be described.

The first and second p-type semiconductor layers 11 and 12 of the set includes a first upper portion $S_3$ in contact with the electron transit layer 3, a second upper portion $S_4$ in contact with the buffer layer 2, a first side portion $S_5$ located between the first upper portion $S_3$ and the second upper portion $S_4$, and a second side portion $S_6$ located between the second upper portion $S_4$ and the lower portion $S_2$ of the semiconductor substrate 1.

The first upper portion $S_3$ is located at a level between the upper end of the electron transit layer 3 and the upper end of the buffer layer 2. However, the first upper portion $S_3$ is provided at a level such that a depletion layer derived from a pn junction (or pi junction) between the electron transit layer 3 and the first p-type semiconductor layer 11 is not brought into contact with the region R in which 2DEGs are produced. In addition, the second upper portion $S_4$ is located at almost the same level as the upper portion $S_1$ of the semiconductor substrate 1. A symbol K denotes a corner located between the second upper portion $S_4$ and the first side portion $S_5$. The first and second upper portions $S_3$ and $S_4$ are shaped to extend in the Y direction as similar to the gate electrode 5, the source electrode 6, and the drain electrode 7.

A symbol $A_1$ indicates an area of a region surrounded by the first side portion $S_5$ in a vicinity of the second upper portion $S_4$. A symbol $A_2$ indicates an area of a region surrounded by the second side portion $S_6$ in a vicinity of the second upper portion $S_4$. In the present embodiment, the area $A_2$ is set to be larger than the area $A_1$ ($A_2 > A_1$), and is specifically set to be twice or more times as large as the area $A_1$ ($A_2 \geq 2A_1$).

The first p-type semiconductor layer 11 includes the first upper portion $S_3$ and the first side portion $S_5$. The first p-type semiconductor layer 11 is a compound semiconductor layer containing gallium (Ga) and nitrogen (N). The first p-type semiconductor layer 11 is, for example, a p-type GaN layer formed by homoepitaxial growth. The homoepitaxial layer has the advantage of including fewer dislocations.

The second p-type semiconductor layer 12 includes the second upper portion $S_4$ and the second side portion $S_6$, is formed of a semiconductor material different from that of the first p-type semiconductor layer 11. The second p-type semiconductor layer 12 is a compound semiconductor layer containing aluminum (Al), gallium (Ga) and nitrogen (N). The second p-type semiconductor layer 12 is, for example, a p-type AlGaN layer. The second p-type semiconductor layer 12 includes a first portion 12a located between the first upper portion $S_3$ and the upper portion $S_1$ of the semiconductor substrate 1, and a second portion 12b located between the upper portion $S_1$ and the lower portion $S_2$ of the semiconductor substrate 1.

The first insulator 13 is formed between the second upper portion $S_4$ and the lower portion $S_2$ of the semiconductor substrate 1 so as to be contact the second p-type semiconductor layer 12. The second insulator 14 is formed on the lower portion $S_2$ of the semiconductor substrate 1 so as to cover the second p-type semiconductor layer 12 and the first insulator 13. Each of the first insulator 13 and the second insulator 14 is, for example, a silicon oxide ($SiO_2$) film or an aluminum oxide ($Al_2O_3$) film.

For example, the first and second p-type semiconductor layers 11 and 12 and the first and second insulators 13 and 14 can be formed by forming a trench in the lower portion $S_2$ of the semiconductor substrate 1, sequentially forming the first p-type semiconductor layer 11, the second p-type semiconductor layer 12, and the first insulator 13 in the trench, and forming the second insulator 14 so as to cover the second p-type semiconductor layer 12 and the first insulator 13. However, the first and second p-type semiconductor layers 11 and 12 and the first and second insulators 13 and 14 may be formed by other methods.

Figure 2:
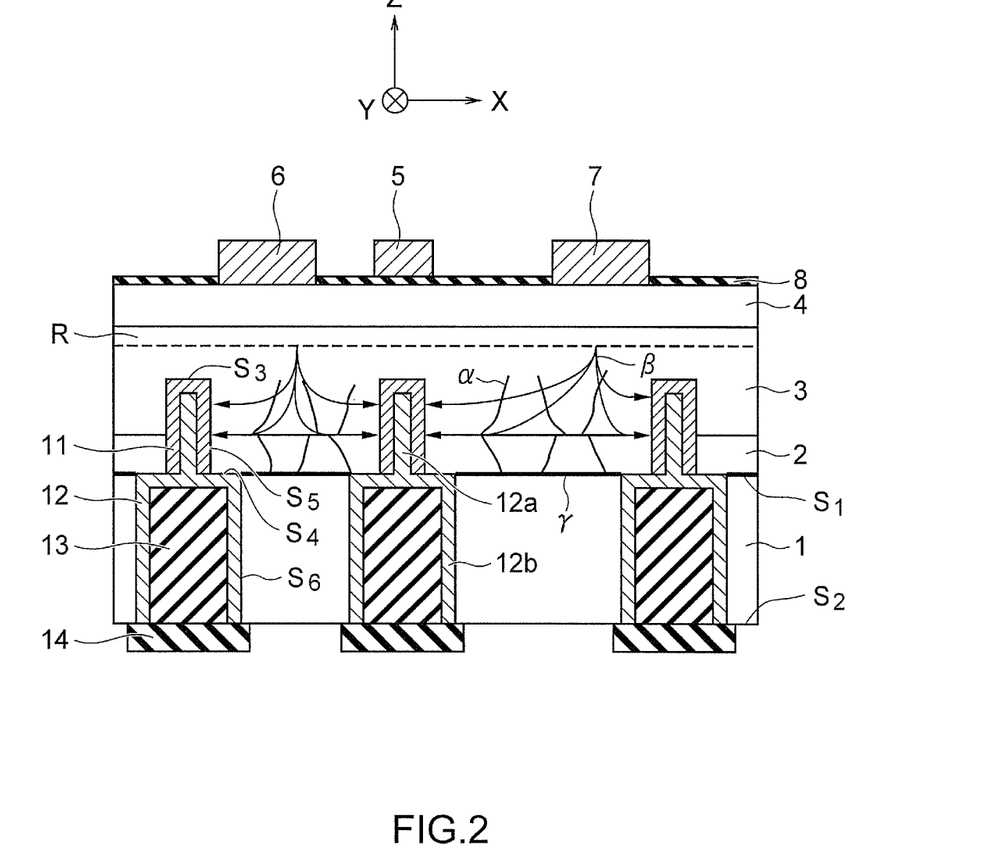
FIG. 2 is a cross-sectional view for illustrating details of the semiconductor device of the first embodiment.

FIG. 2 is a cross-sectional view for illustrating details of the semiconductor device of the first embodiment.

As shown in FIG. 2, the buffer layer 2 and the electron transit layer 3 include many dislocations α. As for the densities of the dislocations α in the buffer layer 2, the electron transit layer 3 and the electron supply layer 4, the buffer layer 2 has the highest density whereas the electron supply layer 4 has the lowest density. When the breakdown voltage of the HEMT is increased, leakage currents will flow along the dislocations α as indicated by arrows β. These leakage currents will flow toward chip end surfaces of the semiconductor device.

Furthermore, when the breakdown voltage of the HEMT is increased, carriers are generated between the semiconductor substrate 1 and the buffer layer 2 to form inversion layers (or accumulation layers, the same shall apply hereafter) γ. As a result, a state like a short channel is generated between the source electrode 6 and the drain electrode 7, thereby generating leakage currents. These leakage currents will also flow toward the chip end surfaces of the semiconductor device.

In the present embodiment, pn junctions (or pi junctions, the same shall apply hereafter) are however formed between the electron transit layer 3 and the first p-type semiconductor layer 11, and between the semiconductor substrate 1 and the second p-type semiconductor layer 12. Depletion layers which lack electrons or holes are generated at these pn junctions. Therefore, a potential barrier derived from these pn junctions limits the flows of the leakage currents. In other words, the potential barrier blocks the leakage paths. Accordingly, the present embodiment makes it possible to suppress the flows of the leakage currents caused by the inversion layers γ and the dislocations α to improve the breakdown voltage of the HEMT.

Furthermore, the first and second p-type semiconductor layers 11 and 12 of the present embodiment include the second upper portion $S_4$ between the first side portion $S_5$ and the second side portion $S_6$ so as to contact the buffer layer 2. Accordingly, in order to cause the leakage currents derived from the inversion layers γ to flow to the chip end surfaces, the leakage currents need to pass through a long p-type layer (second p-type semiconductor layer 12) along the second upper portion $S_4$. Therefore, according to the present embodiment, this long p-type layer can prevent the leakage currents derived from the inversion layers γ from flowing to the chip end surfaces.

The p-type layer is desirably long in the X direction as much as possible. However, the corner K located between the second upper portion $S_4$ and the first side portion $S_5$ is rounded by an etching process or an etch-back process in some cases. Therefore, the p-type layer is desirably set to be sufficiently long in the X direction, also in consideration of cases where the corner K is rounded.

Accordingly, the area $A_2$ in the present embodiment is set to be twice or more times as large as the area $A_1$. By this means, the present embodiment allows the p-type layer to be set to be sufficiently long in the X direction.

(Semiconductor Devices of Modifications of First Embodiment)

Figure 3:
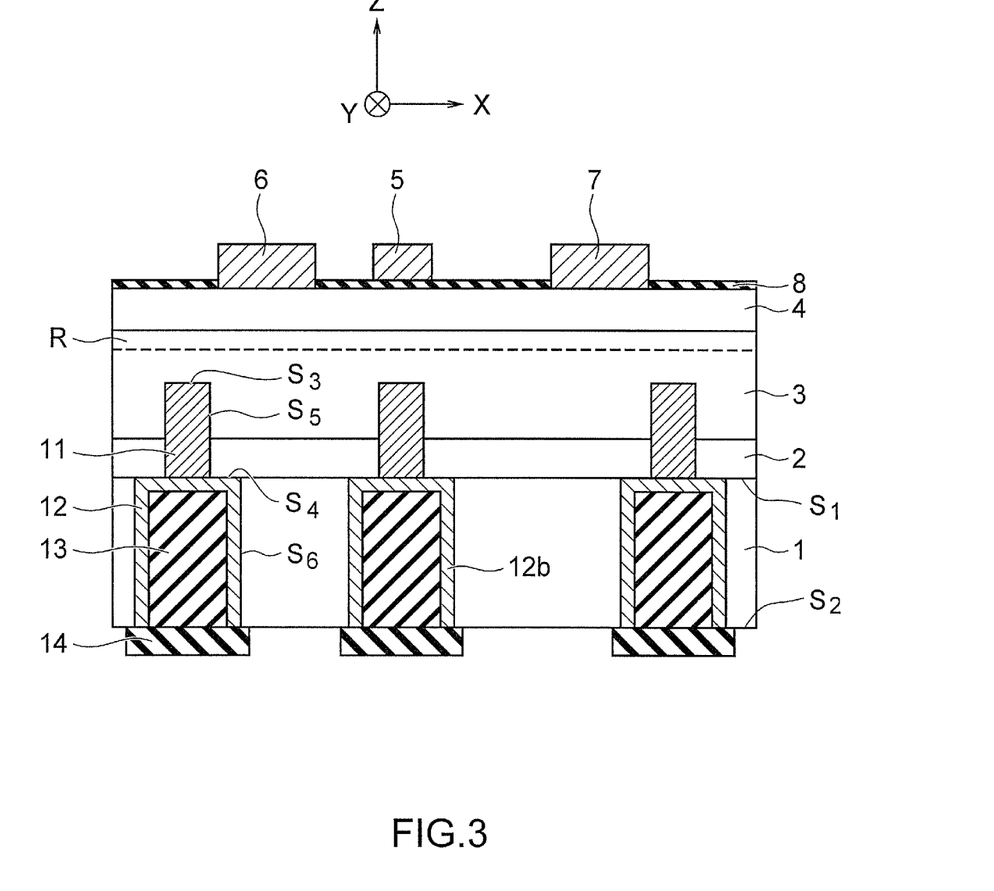
FIG. 3 is a cross-sectional view illustrating a structure of a semiconductor device of a first modification of the first embodiment.

FIG. 3 is a cross-sectional view illustrating a structure of a semiconductor device of a first modification of the first embodiment.

The second p-type semiconductor layer 12 in FIG. 1 includes the first portion 12a located between the first upper portion $S_3$ and the upper portion $S_1$ of the semiconductor substrate 1, and the second portion 12b located between the upper portion $S_1$ and lower portion $S_2$ of the semiconductor substrate 1.

On the other hand, the second p-type semiconductor layer 12 in FIG. 3 includes the second portion 12b located between the upper portion $S_1$ and lower portion $S_2$ of the semiconductor substrate 1, and does not include the first portion 12a located between the first upper portion $S_3$ and the upper portion $S_1$ of the semiconductor substrate 1.

Figure 4:
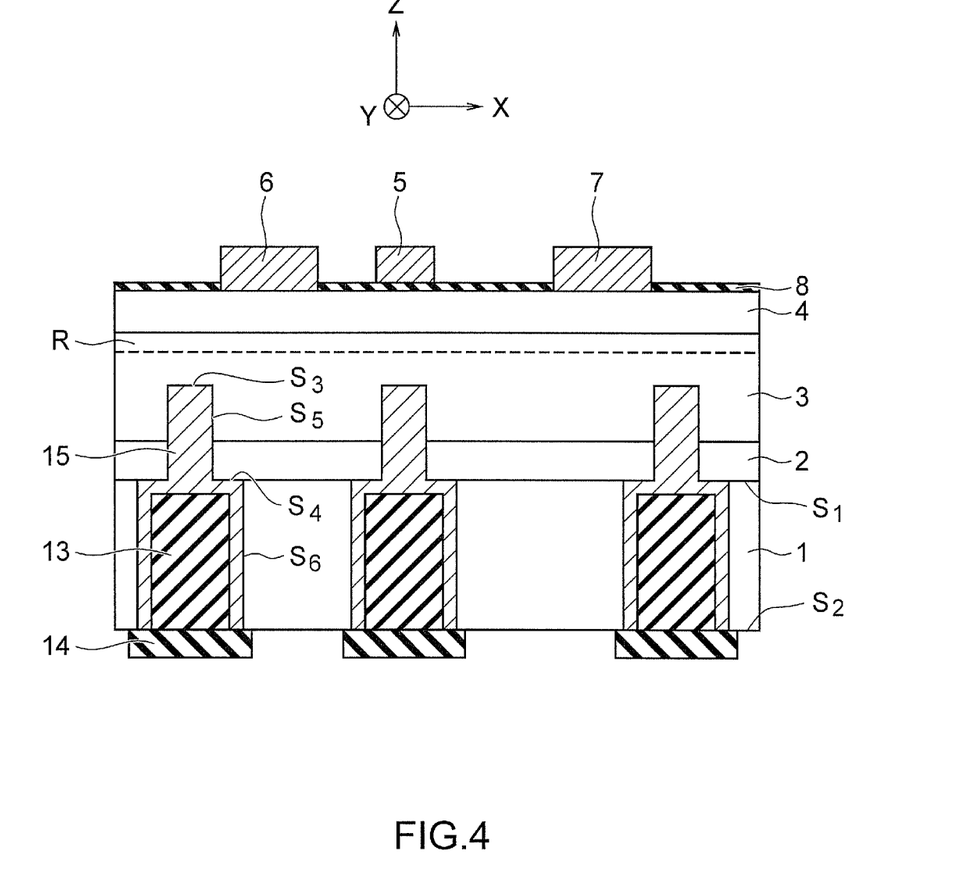
FIG. 4 is a cross-sectional view illustrating a structure of a semiconductor device of a second modification of the first embodiment.

FIG. 4 is a cross-sectional view illustrating a structure of a semiconductor device of a second modification of the first embodiment.

The semiconductor device in FIG. 4 has the structure in which the first and second p-type semiconductor layers 11 and 12 of the semiconductor device in FIG. 1 are replaced by a third p-type semiconductor layer 15. Therefore, the first upper portion $S_3$, the second upper portion $S_4$, the first side portion $S_5$, and the second side portion $S_6$ in FIG. 4 are formed of the same semiconductor material (i.e., the material of the third p-type semiconductor layer 15). The third p-type semiconductor layer 15 is a compound semiconductor layer containing Ga and N. The third p-type semiconductor layer 15 is, for example, a p-type GaN layer formed by homoepitaxial growth. The third p-type semiconductor layer 15 is an example of the third semiconductor layer.

Figure 5:
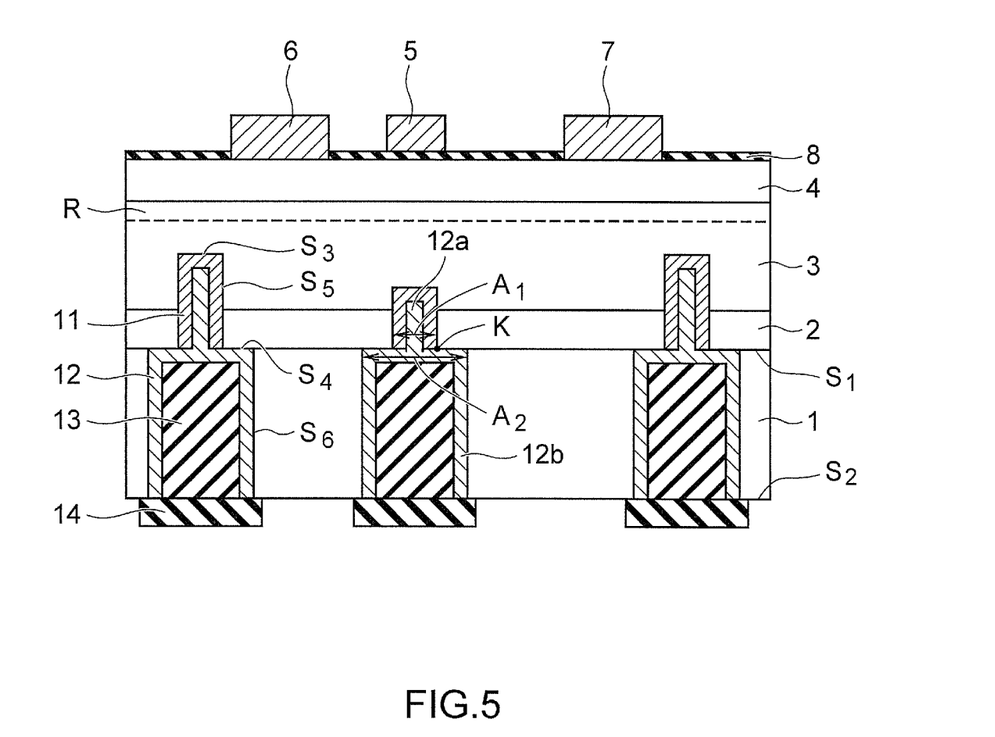
FIG. 5 is a cross-sectional view illustrating a structure of a semiconductor device of a third modification of the first embodiment.

FIG. 5 is a cross-sectional view illustrating a structure of a semiconductor device of a third modification of the first embodiment.

The first upper portion $S_3$ immediately below the gate electrode 5 in FIG. 1 is provided at the same level as the first upper portions $S_3$ immediately below the source electrode 6 and the drain electrode 7. For example, the first upper portions $S_3$ having the shapes shown in FIG. 1 have an advantage of being easily manufactured.

On the other hand, the first upper portion $S_3$ immediately below the gate electrode 5 in FIG. 5 is provided at a lower level than the first upper portions $S_3$ immediately below the source electrode 6 and the drain electrode 7. For example, the first upper portion $S_3$ immediately below the gate electrode 5 in FIG. 5 is desirably provided at a level closer to the level of the upper end of the buffer layer 2. For example, the first upper portions $S_3$ having the shapes shown in FIG. 5 have an advantage of preventing the electron mobility in the 2DEG layer which serves as an electron pathway from being decreased.

The first upper portions $S_3$ having the shapes shown in FIG. 5 can be also applied to the semiconductor devices in FIGS. 3 and 4 and semiconductor devices in FIGS. 6 to 8 as will be described later.

In the present embodiment, the structure shown in FIG. 3, 4, or 5 may be adopted in place of the structure shown in FIG. 1.

The semiconductor devices in FIGS. 1, 3, 4, and 5 will be compared below.

The semiconductor devices in FIGS. 1, 3, and 5 use not only the first p-type semiconductor layer 11 which is a GaN layer, but also the second p-type semiconductor layer 12 which is an AlGaN layer. For example, the AlGaN layer has an advantage of being larger in bandgap than the GaN layer, and able to improve the breakdown voltage of the HEMT.

On the other hand, the semiconductor device in FIG. 4 uses only the third p-type semiconductor layer 15 which is a GaN layer, in place of the first and second p-type semiconductor layers 11 and 12. Since only the GaN layer is used without using the AlGaN layer in this case, this case can provide an advantage of being able to simplify the manufacturing process for the semiconductor device as compared with the cases of using the GaN layer and the AlGaN layer. In addition, the third p-type semiconductor layer 15 may be an AlGaN layer in place of the GaN layer.

As described above, the semiconductor device of the present embodiment includes the p-type semiconductor layers 11 and 12 (or the p-type semiconductor layer 15) including the first upper portion $S_3$ in contact with the electron transit layer 3, the second upper portion $S_4$ in contact with the buffer layer 2, the first side portion $S_5$ located between the first upper portion $S_3$ and the second upper portion $S_4$, and the second side portion $S_6$ located between the second upper portion $S_4$ and the lower portion $S_2$ of the semiconductor substrate 1. Accordingly, the present embodiment makes it possible to suppress the flows of the leakage currents caused by the inversion layers, the accumulation layers and the dislocations to improve the breakdown voltage of the HEMT.

Second Embodiment

Figure 6:
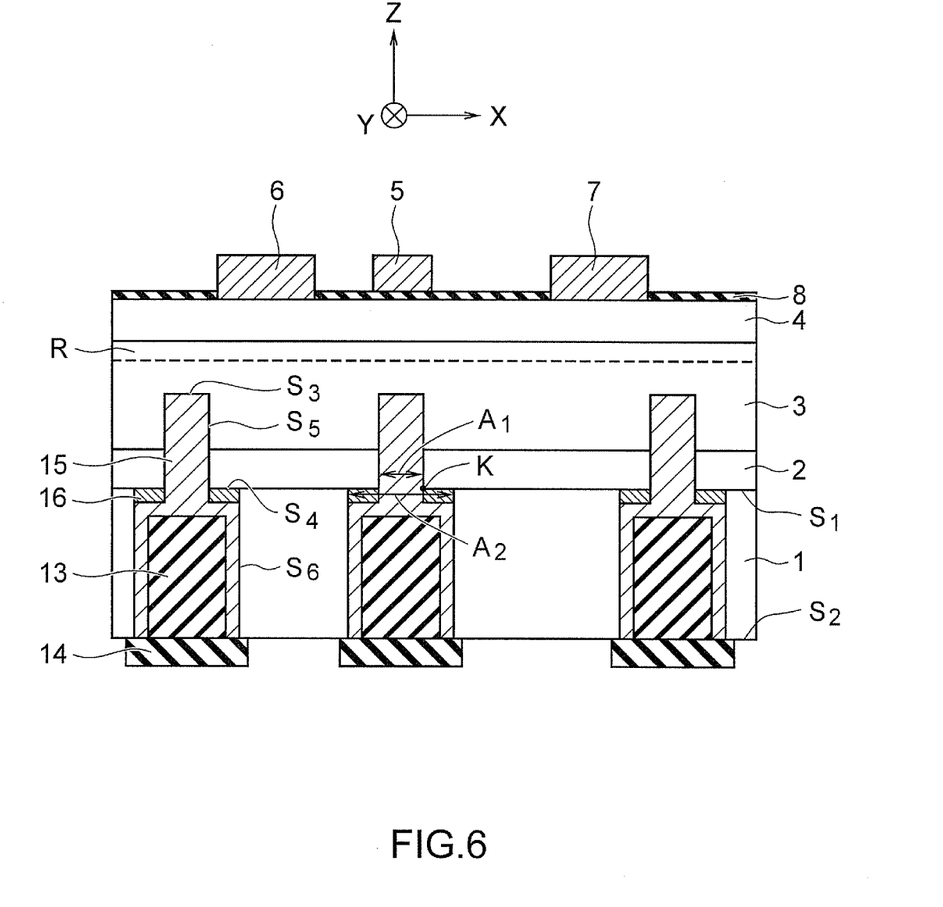
FIG. 6 is a cross-sectional view illustrating a structure of a semiconductor device of a second embodiment.

FIG. 6 is a cross-sectional view illustrating a structure of a semiconductor device of a second embodiment.

The semiconductor device in FIG. 6 includes fourth p-type semiconductor layers 16 in addition to the components shown in FIG. 4. The third and fourth p-type semiconductor layers 15 and 16 in FIG. 6 are an example of the third semiconductor layer. In addition, the third and fourth p-type semiconductor layers 15 and 16 in FIG. 6 are respectively examples of the first and second layers of the third semiconductor layer.

Hereinafter, an arbitrary set of third and fourth p-type semiconductor layers 15 and 16 and first and second insulators 13 and 14 will be described.

The third p-type semiconductor layer 15 of the set includes the first upper portion $S_3$, the first side portion $S_5$, and the second side portion $S_6$. On the other hand, the fourth p-type semiconductor layer 16 of the set includes the second upper portion $S_4$. The fourth p-type semiconductor layer 16 is, for example, a silicon layer containing p-type impurities.

For example, the fourth p-type semiconductor layer 16 can be formed by forming, in the lower portion $S_2$ of the semiconductor substrate 1, a first trench having a bottom between the upper portion $S_1$ and lower portion $S_2$ of the semiconductor substrate 1, implanting the p-type impurities into the semiconductor substrate 1 at the bottom of the first trench, and then forming a second trench at the bottom of the first trench.

In this case, the fourth p-type semiconductor layer 16 is a p-type semiconductor region formed in the semiconductor substrate 1.

When the semiconductor substrate 1 is an n-type substrate, the p-type impurities are implanted so that the impurity concentration of the fourth p-type semiconductor layer 16 is set to a concentration which forms a potential barrier derived from a pn junction. On the other hand, when the semiconductor substrate 1 is a p-type substrate, the impurity concentration of the fourth p-type semiconductor layer 16 is preferably set to be higher than the impurity concentration of the p-type semiconductor substrate 1, to the extent that the crystallinity of the p-type semiconductor substrate 1 is not affected. In these cases, the thickness of the fourth p-type semiconductor layer 16 is preferably set to be a thickness through which the p-type impurities can be implanted. For example, the thickness of the fourth p-type semiconductor layer 16 is desirably 1 µm or greater (more specifically, 3 µm or greater).

In addition, the third p-type semiconductor layer 15 and the second insulator 13 and 14 can be formed by, for example, sequentially forming the third p-type semiconductor layer 15 and the first insulator 13 in the first and second trenches, and forming the second insulator 14 so as to cover the third p-type semiconductor layer 15 and the first insulator 13. However, the third p-type semiconductor layer 15 and the first and second insulators 13 and 14 may be formed by other methods.

Continuously with reference to FIG. 6, the semiconductor device of the second embodiment will be described in detail. Symbols α, β and γ have the same meanings as in FIG. 2.

The first and second p-type semiconductor layers 11 and 12 in FIG. 2 have the second upper portion $S_4$ between the first side portion $S_5$ and the second side portion $S_6$ so as to contact the buffer layer 2. Therefore, in order to cause the leakage currents derived from the inversion layers (or the accumulation layers, the same shall apply hereafter) γ to flow to the chip end surfaces, the leakage currents need to pass through the long p-type layer (second p-type semiconductor layer 12) along the second upper portion $S_4$.

Similarly, the third and fourth p-type semiconductor layers 15 and 16 in FIG. 6 also have the second upper portion $S_4$ between the first side portion $S_5$ and the second side portion $S_6$ so as to contact the buffer layer 2. Therefore, in order to cause the leakage currents derived from the inversion layers γ to flow to the chip end surfaces, the leakage currents need to pass through a long p-type layer (fourth p-type semiconductor layer 16) along the second upper portion $S_4$.

Therefore, according to the present embodiment, this fourth p-type semiconductor layer 16 can prevent the leakage currents derived from the inversion layers γ from flowing to the chip end surfaces.

(Semiconductor Devices of Modifications of Second Embodiment)

Figure 7:
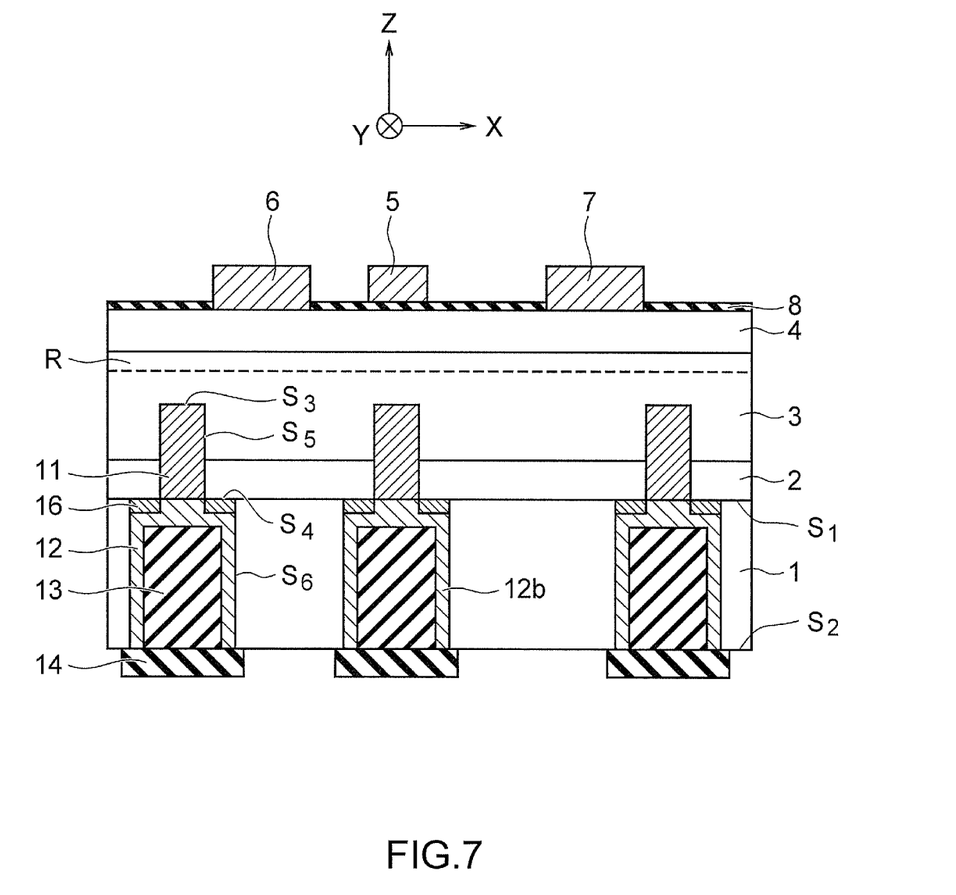
FIG. 7 is a cross-sectional view illustrating a structure of a semiconductor device of a first modification of the second embodiment.

FIG. 7 is a cross-sectional view illustrating a structure of a semiconductor device of a first modification of the second embodiment.

The semiconductor device in FIG. 7 has the structure in which the third p-type semiconductor layer 15 of the semiconductor device in FIG. 6 is replaced by the first and second p-type semiconductor layers 11 and 12. The first, second and fourth p-type semiconductor layers 11, 12, and 16 in FIG. 7 are an example of the third semiconductor layer. In addition, the first, second and fourth p-type semiconductor layers 11, 12 and 16 in FIG. 7 are respectively examples of first, second and third layers of the third semiconductor layer.

The first p-type semiconductor layer 11 includes the first upper portion $S_3$ and the first side portion $S_5$. The second p-type semiconductor layer 12 includes the second side portion $S_6$. The first, second and fourth p-type semiconductor layers 11, 12 and 16 are formed of different semiconductor materials from each other.

Figure 8:
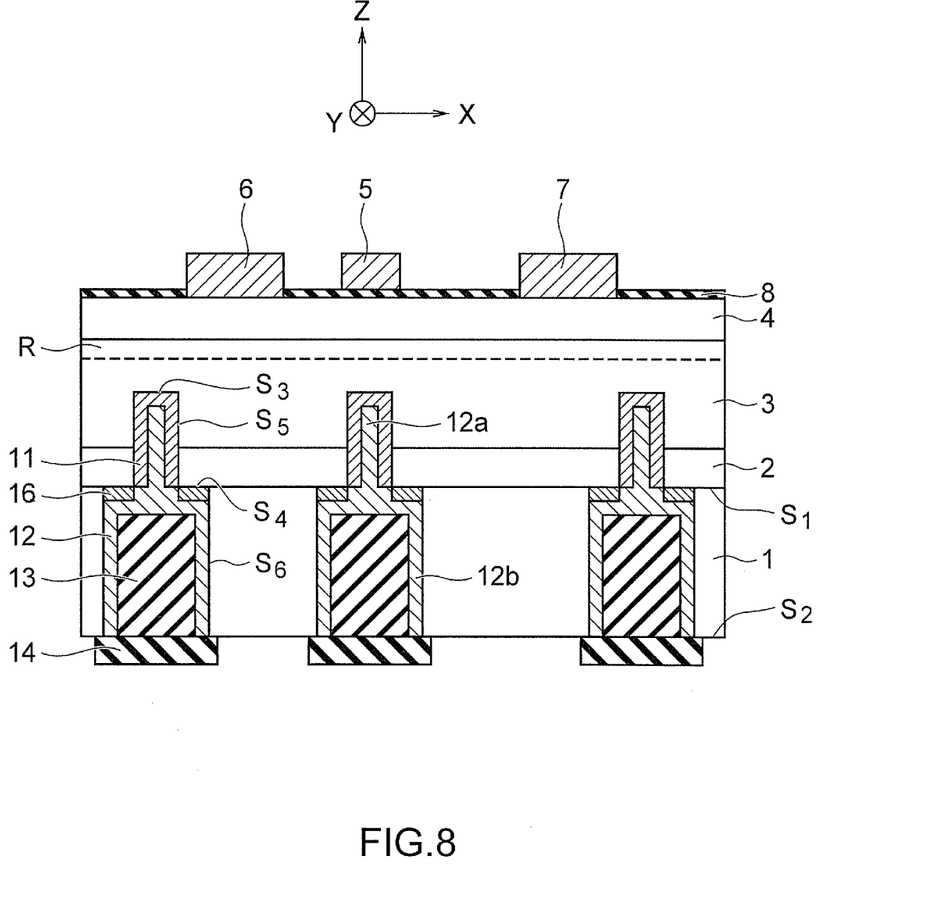
FIG. 8 is a cross-sectional view illustrating a structure of a semiconductor device of a second modification of the second embodiment.

FIG. 8 is a cross-sectional view illustrating a structure of a semiconductor device of a second modification of the second embodiment.

The second p-type semiconductor layer 12 in FIG. 7 includes the second portion 12b located between the upper portion $S_1$ and the lower portion $S_2$ of the semiconductor substrate 1, and does not include the first portion 12a located between the first upper portion $S_3$ and the upper portion $S_1$ of the semiconductor substrate 1.

On the other hand, the second p-type semiconductor layer 12 in FIG. 8 includes the first portion 12a located between the first upper portion $S_3$ and the upper portion $S_1$ of the semiconductor substrate 1, and the second portion 12b located between the upper portion $S_1$ and the lower portion $S_2$ of the semiconductor substrate 1.

In the present embodiment, the structure shown in FIG. 7 or 8 may be adopted in place of the structure shown in FIG. 6.

As described above, the semiconductor device of the present embodiment includes the p-type semiconductor layers 15 and 16 (or the p-type semiconductor layers 11, 12 and 16) including the first upper portion $S_3$ in contact with the electron transit layer 3, the second upper portion $S_4$ in contact with the buffer layer 2, the first side portion $S_5$ located between the first upper portion $S_3$ and the second upper portion $S_4$, and the second side portion $S_6$ located between the second upper portion $S_4$ and the lower portion $S_2$ of the semiconductor substrate 1. Accordingly, the present embodiment makes it possible to suppress the flows of the leakage currents caused by the inversion layers, the accumulation layers and the dislocations to improve the breakdown voltage of the HEMT.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A HEMT semiconductor device comprising:
    a first semiconductor layer of a first conductivity type or an intrinsic type;
    a second semiconductor layer of the first conductivity type or the intrinsic type disposed above the first semiconductor layer;
    a control electrode disposed above the second semiconductor layer; and
    third semiconductor layers of a second conductivity type, each of which includes a first upper portion in contact with the first semiconductor layer, a second upper portion located at a lower position than the first upper portion, a first side portion located between the first upper portion and the second upper portion, and a second side portion located at a lower position than the first side portion,
    wherein the control electrode is placed immediately above one of the third semiconductor layers,
    an area of a region surrounded by the second side portion in a vicinity of the second upper portion is twice or more times as large as an area of a region surrounded by the first side portion in a vicinity of the second upper portion, and a level of the first upper portion of the one of the third semiconductor layers placed immediately below the control electrode is lower than a level of the first upper portion of other third semiconductor layers placed other than immediately below the control electrode.

2. A HEMT semiconductor device comprising:
a semiconductor substrate;
a first film disposed above the semiconductor substrate;
a first semiconductor layer of a first conductivity type or an intrinsic type disposed above the first film;
a second semiconductor layer of the first conductivity type or the intrinsic type disposed above the first semiconductor layer;
a control electrode disposed above the second semiconductor layer; and
third semiconductor layers of a second conductivity type, each of which includes a first upper portion in contact with the first semiconductor layer, a second upper portion in contact with the first film, a first side portion located between the first upper portion and the second upper portion, and a second side portion located between the second upper portion and a lower portion of the semiconductor substrate,
wherein the control electrode is placed immediately above one of the third semiconductor layers,
an area of a region surrounded by the second side portion in a vicinity of the second upper portion is twice or more times as large as an area of a region surrounded by the first side portion in a vicinity of the second upper portion, and
a level of the first upper portion of the one of the third semiconductor layer placed immediately below the control electrode is lower than a level of the first upper portion of other third semiconductor layers placed other than immediately below the control electrode.

3. The device of claim 1, wherein each of the third semiconductor layers comprises:
a first layer including the first upper portion and the first side portion; and
a second layer including the second upper portion and the second side portion, and formed of a material different from a material of the first layer.

4. The device of claim 3, wherein
the first layer is a first compound semiconductor layer, and
the second layer is a second compound semiconductor layer formed of a material different from a material of the first compound semiconductor layer.

5. The device of claim 4, wherein
the first compound semiconductor layer contains gallium and nitrogen, and
the second compound semiconductor layer contains aluminum, gallium and nitrogen.

6. The device of claim 3, wherein a bandgap in the second layer is larger than a bandgap in the first layer.

7. The device of claim 2,
wherein each of the third semiconductor layers comprises:
a first layer including the first upper portion and the first side portion; and
a second layer including the second upper portion and the second side portion, and formed of a material different from a material of the first layer, and
wherein the second layer comprises:
a first portion located between the first upper portion and an upper portion of the semiconductor substrate; and a second portion located between the upper portion of the semiconductor substrate and the lower portion of the semiconductor substrate.

8. The device of claim 1, wherein each of the third semiconductor layers is a compound semiconductor layer.

9. The device of claim 8, wherein the compound semiconductor layer contains at least gallium and nitrogen.

10. The device of claim 2, wherein each of the third semiconductor layers comprises:
a first layer including the first upper portion, the first side portion; and
a second layer including the second upper portion, the second side portion and formed of a material different from a material of the first layer.

11. The device of claim 10, wherein the second layer is formed of same material as the semiconductor substrate, and contains impurities of the second conductivity type.

12. The device of claim 10, wherein the second layer comprises:
a first portion located between the first upper portion and an upper portion of the semiconductor substrate; and
a second portion located between the upper portion of the semiconductor substrate and the lower portion of the semiconductor substrate.

13. The device of claim 2, further comprising a first insulator disposed between the second upper portion and the lower portion of the semiconductor substrate, and disposed to contact the third semiconductor layers.

14. The device of claim 13, further comprising a second insulator disposed above the lower portion of the semiconductor substrate, and disposed to cover the third semiconductor layers and the first insulator.

15. A HEMT semiconductor device comprising:
a first semiconductor layer of a first conductivity type or an intrinsic type;
a second semiconductor layer of the first conductivity type or the intrinsic type disposed above the first semiconductor layer;
a control electrode, a first main electrode and a second main electrode disposed above the second semiconductor layer; and
third semiconductor layers of a second conductivity type, each of which includes a first upper portion in contact with the first semiconductor layer, a second upper portion located at a lower position than the first upper portion, a first side portion located between the first upper portion and the second upper portion, and a second side portion located at a lower position than the first side portion,
wherein the control electrode is placed immediately above one of the third semiconductor layer,
an area of a region surrounded by the second side portion in a vicinity of the second upper portion is twice or more times as large as an area of a region surrounded by the first side portion in a vicinity of the second upper portion, and
a level of the first upper portion of the one of the third semiconductor layers placed immediately below the control electrode is lower than a level of the first upper portion of other third semiconductor layers placed other than immediately below the control electrode.

16. The device of claim 15, wherein each of the first and second main electrode is placed at a position between two third semiconductor layers adjacent to each other.

* * * * *